United States Patent
Nogami et al.

(10) Patent No.: US 7,422,975 B2
(45) Date of Patent: Sep. 9, 2008

(54) COMPOSITE INTER-LEVEL DIELECTRIC STRUCTURE FOR AN INTEGRATED CIRCUIT

(75) Inventors: Takeshi Nogami, Hopewell Junction, NY (US); Kensaku Ida, Wappingers Falls, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 253 days.

(21) Appl. No.: 11/206,361

(22) Filed: Aug. 18, 2005

(65) Prior Publication Data

US 2007/0042589 A1  Feb. 22, 2007

(51) Int. Cl.
*H01L 21/44* (2006.01)
*H01L 23/48* (2006.01)

(52) U.S. Cl. ............... 438/619; 438/623; 438/666; 438/787; 257/758; 257/759; 257/E21.273; 257/E21.576; 257/E21.581

(58) Field of Classification Search ........... 438/597, 438/619, 623, 666, 787; 257/758, 759
See application file for complete search history.

(56) References Cited

U.S. PATENT DOCUMENTS

| | | | | | |
|---|---|---|---|---|---|
| 5,461,003 | A | * | 10/1995 | Havemann et al. | 438/666 |
| 5,789,819 | A | * | 8/1998 | Gnade et al. | 257/759 |
| 6,303,486 | B1 | * | 10/2001 | Park | 438/618 |
| 6,576,551 | B1 | * | 6/2003 | Chang et al. | 438/690 |
| 6,703,324 | B2 | * | 3/2004 | Wong | 438/787 |
| 6,924,222 | B2 | | 8/2005 | Goodner et al. | 438/622 |
| 6,930,034 | B2 | * | 8/2005 | Colburn et al. | 438/619 |
| 6,984,581 | B2 | * | 1/2006 | Wong | 438/623 |
| 7,057,287 | B2 | * | 6/2006 | Kumar et al. | 257/758 |
| 7,098,476 | B2 | * | 8/2006 | Babich et al. | 257/62 |
| 7,115,993 | B2 | * | 10/2006 | Wetzel et al. | 257/758 |
| 7,166,531 | B1 | * | 1/2007 | van den Hoek et al. | 438/623 |
| 2001/0033509 | A1 | | 10/2001 | Ahn et al. | 365/63 |
| 2002/0064592 | A1 | | 5/2002 | Datta et al. | 427/98 |
| 2002/0081381 | A1 | | 6/2002 | DelaRosa et al. | 427/255.28 |
| 2003/0082845 | A1 | | 5/2003 | Hoffman et al. | 438/106 |
| 2003/0143837 | A1 | | 7/2003 | Gandikota et al. | 438/629 |
| 2003/0210103 | A1 | | 11/2003 | Park et al. | 333/1 |
| 2003/0218253 | A1 | | 11/2003 | Avanzino et al. | 257/758 |
| 2004/0005753 | A1 | | 1/2004 | Kostamo et al. | 438/222 |
| 2004/0094402 | A1 | | 5/2004 | Gopalraja et al. | 204/192.12 |

(Continued)

*Primary Examiner*—Michael S Lebentritt
(74) *Attorney, Agent, or Firm*—Mayer & Williams PC; Stuart H. Mayer, Esq.; Karin L. Williams, Esq.

(57) ABSTRACT

A method is provided for making an inter-level dielectric for a microelectronic device formed on a substrate. The method begins by forming first and second spacer layers over a substrate layer. The spacer layers are formed from a sacrificial dielectric material. Next, first and second dielectric layers are formed on the first and second spacer layers, respectively, such that each of the first and second dielectric layers is separated by one of the spacer layers. The first and second dielectric layers each include a first and second dielectric component. The second dielectric component is a sacrificial dielectric material. At least a portion of the second dielectric component is removed to thereby form voids in the first and second dielectric layers. At least a portion of the sacrificial dielectric material in the first and second spacer layers is also removed to thereby form voids in the first and/or second spacer layers.

18 Claims, 1 Drawing Sheet

U.S. PATENT DOCUMENTS

| | | | |
|---|---|---|---|
| 2004/0099952 A1 | 5/2004 | Goodner et al. | 257/758 |
| 2004/0102006 A1 | 5/2004 | Xu et al. | 438/259 |
| 2004/0113222 A1 | 6/2004 | Ozguz et al. | 257/459 |
| 2004/0130027 A1 | 7/2004 | Chen et al. | 257/758 |
| 2004/0130032 A1* | 7/2004 | Gronbeck et al. | 257/759 |
| 2004/0161922 A1 | 8/2004 | Gallagher et al. | 438/623 |
| 2004/0185679 A1 | 9/2004 | Ott et al. | 438/781 |
| 2004/0207091 A1 | 10/2004 | Wang et al. | 257/758 |
| 2004/0253805 A1 | 12/2004 | Dubin et al. | 438/618 |
| 2005/0059234 A1 | 3/2005 | Bera et al. | 438/633 |
| 2005/0062034 A1 | 3/2005 | Dubin | 257/20 |
| 2005/0079706 A1 | 4/2005 | Kumar et al. | 438/638 |
| 2005/0088647 A1 | 4/2005 | Shanmugasundram et al. | 356/72 |
| 2005/0093155 A1 | 5/2005 | Kahlert et al. | 257/751 |
| 2005/0110145 A1 | 5/2005 | Elers | 257/751 |
| 2005/0118807 A1 | 6/2005 | Kim et al. | 438/686 |
| 2005/0139948 A1 | 6/2005 | Chung et al. | 257/486 |
| 2005/0142853 A1 | 6/2005 | Jui-Neng | 438/624 |
| 2006/0046044 A1* | 3/2006 | Lee et al. | 428/304.4 |

* cited by examiner

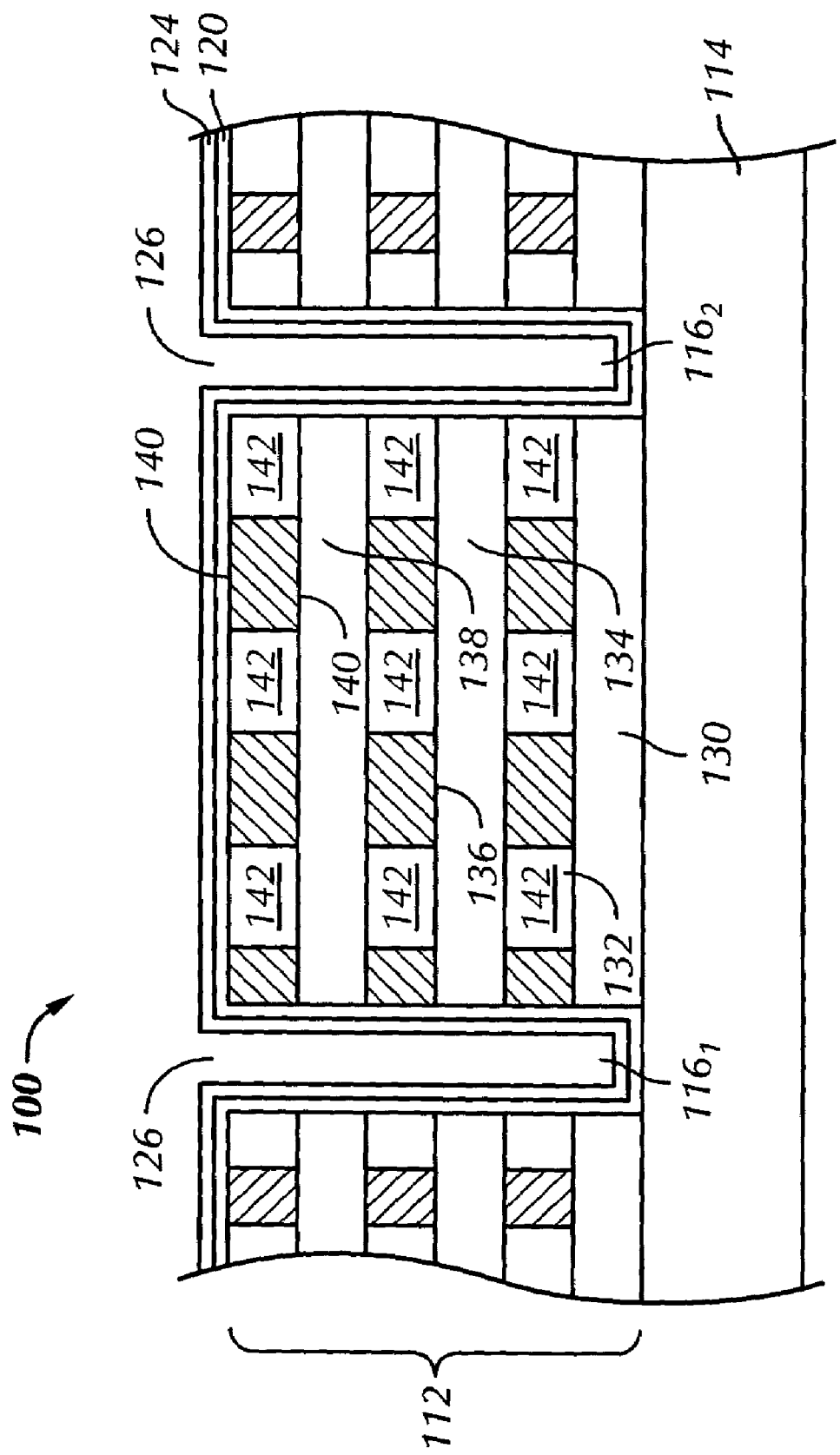

COMPOSITE INTER-LEVEL DIELECTRIC STRUCTURE FOR AN INTEGRATED CIRCUIT

FIELD OF THE INVENTION

The present invention relates generally to dual damascene interconnections for integrated circuits, and more specifically to a dual damascene interconnection having a composite dielectric structure comprising a series of alternating layers of dielectric material and spacers.

BACKGROUND OF THE INVENTION

The manufacture of integrated circuits in a semiconductor device involves the formation of a sequence of layers that contain metal wiring. Metal interconnects and vias which form horizontal and vertical connections in the device are separated by insulating layers or inter-level dielectric layers (ILDs) to prevent crosstalk between the metal wiring that can degrade device performance. A popular method of forming an interconnect structure is a dual damascene process in which vias and trenches are filled with metal in the same step to create multi-level, high density metal interconnections needed for advanced high performance integrated circuits. A frequently used approach is a via first process in which a via is formed in a dielectric layer and then a trench is formed above the via. Recent achievements in dual damascene processing include lowering the resistivity of the metal interconnect by switching from aluminum to copper, decreasing the size of the vias and trenches with improved lithographic materials and processes to improve speed and performance, and reducing the dielectric constant (k) of insulators or ILDs by using so-called low k materials to avoid capacitance coupling between the metal interconnects. The expression "low-k" material has evolved to characterize materials with a dielectric constant less than about 3.9. One class of low-k material that have been explored are organic low-k materials, typically having a dielectric constant of about 2.0 to about 3.8, which may offer promise for use as an ILD.

Many of the low k materials, however, have properties that are incompatible with other materials employed to fabricate semiconductor devices or are incompatible with processes employed to fabricate the semiconductor devices. For example, layers formed from low dielectric materials are often structurally compromised by Chemical Mechanical Polishing (CMP) processes through erosion, as well as adsorption of CMP slurry chemicals. Etching processes often produce micro-trenches and rough surfaces in layers formed from materials having low dielectric constants, which is often unsuitable for subsequent photolithography processes. As a result, these materials are problematic to integrate into damascene fabrication processes.

To further reduce the dielectric constant of ILDs, structures have been proposed to incorporate void spaces or "air gaps" using, for example, sacrificial materials, in attempts to obtain dielectric constants closer to that of vacuum. For example, U.S. Pat. No. 6,924,222 shows a composite ILD in which a porous dielectric layer is formed over a sacrificial dielectric layer. The sacrificial dielectric layer is formed from a material that is soluble in supercritical carbon dioxide, examples of which include highly-fluorinated or siloxane-based polymer dielectric materials. The porous dielectric layer material may be a zeolite or polymeric material. Subsequent to other processing treatments such as CMP, a portion of the sacrificial dielectric layer is decomposed and removed through a portion of the porous dielectric layer using supercritical carbon dioxide to thereby leave voids in positions previously occupied by portions of the sacrificial dielectric layer. In this way the composite ILD can provide structural support during formation of the conductive features and also provide load distribution and resistance as forces are applied to adjacent layers, such as during planarization. Only after completion of the processing treatments that may be required or facilitated by the mechanical support provided by completely intact layers are the voids created in the sacrificial layers to further reduce the dielectric constant of the ILD.

One problem with the structure shown in the aforementioned reference is that it is composed of only a single removable sacrificial layer and a single porous dielectric layer. The mechanical integrity of this arrangement can be readily compromised, especially when the lateral distance between the conductive layers is large. In this structure the porous dielectric layer may fracture because of thermal expansion that can distort the dielectric layer during processing.

Accordingly, it would be desirable to provide an interconnect dielectric structure that avoids the use of mechanically fragile low-k materials and which also provides additional structural and mechanical support than is provided by the structure shown in the aforementioned reference.

SUMMARY OF THE INVENTION

In accordance with the present invention, a method is provided for making an inter-level dielectric for a microelectronic device formed on a substrate. The method begins by forming first and second spacer layers over a substrate layer. The spacer layers are formed from a sacrificial dielectric material. Next, first and second dielectric layers are formed on the first and second spacer layers, respectively, such that each of the first and second dielectric layers is separated by one of the spacer layers. The first and second dielectric layers each include a first and second dielectric component. The second dielectric component is a sacrificial dielectric material. At least a portion of the second dielectric component is removed to thereby form voids in the first and second dielectric layers. At least a portion of the sacrificial dielectric material in the first and second spacer layers is also removed to thereby form voids in the first and/or second spacer layers.

In accordance with one aspect of the invention, the step of removing at least a portion of the sacrificial dielectric material in the first and second spacer layers comprises the step removing a majority of the sacrificial dielectric material.

In accordance with another aspect of the invention the step of removing at least a portion of the sacrificial dielectric material in the first and second spacer layers comprises the step removing substantially all of the sacrificial dielectric material.

In accordance with another aspect of the invention, the first dielectric component comprises a material selected from the group consisting of $SiO_2$, SiCOH, BN and SiOF.

In accordance with another aspect of the invention, the first dielectric component comprises a low-k material.

In accordance with another aspect of the invention, the sacrificial dielectric material forming the first and second spacer layers and the second dielectric component are a common dielectric material.

In accordance with another aspect of the invention, the sacrificial dielectric material forming the first and second spacer layers and the second dielectric component are different dielectric materials.

In accordance with another aspect of the invention, a recessed feature is formed through the first and second spacers layers and the second dielectric layers and the recessed feature is filled with a conductive material.

In accordance with another aspect of the invention, a barrier layer is formed over the recessed feature.

In accordance with another aspect of the invention, a seed layer is formed over the barrier layer.

In accordance with another aspect of the invention, the conductive material comprises copper.

In accordance with another aspect of the invention, the sacrificial dielectric material comprises a material selected from the group consisting of branched poly(p-xylene), linear poly(p-phenylene), linear polybutadiene, branched polyethylene, PET, Nylon 6/6, PS-syn, poly(e-caprolactone), PPO, polycarbonate, PPS, PAI, PPA, PMS, PEEK, and PEK.

In accordance with another aspect of the invention, at least one of the removal steps is performed by thermal decomposition.

In accordance with another aspect of the invention, at least one of the removal steps is performed by chemical etching.

In accordance with another aspect of the invention, at least one of the removal steps is performed by plasma etching.

In accordance with another aspect of the invention, the sacrificial dielectric material comprises a polymer material.

In accordance with another aspect of the invention, the polymer material is selected from the group consisting of poly(vinylidene fluoride), poly(tetrafluoroethylene), perfluoropolyether, perfluoro(meth)acrylate, poly(dimethyl siloxane), pFOA and pFOA-b-MMA.

BRIEF DESCRIPTION OF THE DRAWING

FIG. 1 shows a schematic cross-sectional view of an interconnect structure formed on a substrate in accordance with the present invention.

DETAILED DESCRIPTION

FIG. 1 shows a schematic cross-sectional view of a substrate structure 100 formed on a substrate 114. The substrate 114 refers to any workpiece upon which film processing is performed. For example, the substrate 114 may be a silicon semiconductor wafer, or other material layer, which has been formed on the wafer. A composite dielectric structure 112 is deposited over the substrate. The composite dielectric structure 112 is patterned to provide one or more recessed features such as features 116$_1$ and 116$_2$, which may be, for example, vias, trenches, contact holes, or lines extending to an exposed surface portion of the substrate 114. It should be understood by those with skill in the art that the present invention may be used in a dual damascene process flow but is not limited thereto.

In the case of a dual damascene process, a barrier layer 120 may be formed over the substrate structure 100 to line the recessed features 116$_1$ and 116$_2$. The barrier layer 120, which may be tantalum or titanium, for example, is deposited to prevent or inhibit diffusion of subsequently deposited materials over the barrier layer into the underlying substrate or dielectric layers. Next, a thin seed layer may be formed over the barrier layer if the conductive material layer 126 is to be formed by electroplating. The remainder of the recessed features 116$_1$ and 116$_2$ are filled with a conductive material layer 126. The conductive material layer 126, typically copper, is deposited by electroplating or any other appropriate technique.

In accordance with the present invention, composite dielectric structure 112 comprises a series of individual layers 130, 132, 134, 136, 138 and 140. Alternating layers 130, 134 and 138 are spacer layers that are formed by a sacrificial dielectric material that is largely removed subsequent to the formation of features 116 and other processing steps such as CMP. The spacer layers 130, 134, and 138 may be largely devoid of dielectric material or they may comprise multiple voids in which some dielectric material remains. It should be noted that as used herein, the term pore refers to small spaces that are found throughout a bulk material, which give rise to the material's inherent property of being porous. For example, pores are present in low-k materials and in the catalysts used automotive catalytic converters and the like. Generally, pores are about 5 nm or less in diameter. On the other hand, voids are not an inherent property of the material and are not necessarily uniformly distributed throughout the material. Instead, a material may only have only a single void or a relatively small of number voids that may or may not be uniformly distributed throughout the material. Moreover, voids are generally larger than pores, typically being greater than about 5 nm in diameter. The voids in the present invention will generally have diameters between about 5 nm and 50 nm.

In contrast to the spacers layers, the alternating layers 132, 136 and 140 are dielectric layers in which voids 142 are formed. Dielectric layers 132, 136 and 140 may be a conventional dielectric material such as SiO$_2$, SiCOH, BN and SiOF, for example., which are generally non-porous materials. By avoiding the use of conventional low-k materials, the mechanical deficiencies associated therewith can be avoided. The voids 142 are formed by a sacrificial dielectric that has been removed along with the sacrificial dielectric material that is used to form spacer layers 130, 134 and 138. The sacrificial dielectric material used to form the voids 142 may or may not be the same as the sacrificial dielectric material used to form the spacer layers 130, 134 and 138.

Dielectric layers 132, 136 and 140 may be formed by co-depositing a dielectric material such as silicon dioxide and an additional sacrificial material component. The structure may then be treated to remove the sacrificial component such that voids 142 are generated in the ILD at locations where the sacrificial component has been removed. A lower k value is then associated with the dielectric layers 132, 134, 136 and 138 as its overall porosity increases. Upon removal of the sacrificial component in the dielectric layers 132, 136 and 140, the underlying sacrificial layers 130, 134 and 138 can be removed by a variety of techniques depending on the material that is employed. If the sacrificial material used in the dielectric layers 132, 136 and 140 is same as the sacrificial dielectric material used to form the spacer layers 130, 134 and 138, the voids 142 and the spacer layers may be formed at the same time.

The sacrificial dielectric material and the sacrificial material component used to form the spacer layers and the voids, respectively, may be any appropriate material that can be removed by any of a variety of techniques such as thermal decomposition, chemical etching and plasma etching. Moreover, as previously mentioned, the sacrificial dielectric material used to form the spacer layers 130, 134 and 138 and the sacrificial component used in the dielectric layers 132, 136 and 140 may or may not be the same as one another. Such materials include various carbon polymers such as branched poly(p-xylene), linear poly(p-phenylene), linear polybutadiene, and branched polyethylene, Other suitable materials for use as sacrificial material include but are not limited to: Poly (ethylene terephthalate) ("PET"), Polyamide-6,6("Nylon 6/6"), Syndiotactic polystyrene ("PS-syn"), Poly(e-caprolactone), Poly(propylene oxide) ("PPO"), Polycarbonates, Poly (phenylene sulfide) ("PPS"), Polyamideimide ("PAI"), Polyphthalamide ("PPA", "Amodel"), Poly(a-methylstyrene) ("PMS")., Poly(ether ether ketone) ("PEEK"), Poly(ether sulfone) ("PES"), and Poly(ether ketone) ("PEK"). The aforementioned materials may be removed on the basis of differences in thermal decomposition temperatures between them and the remaining dielectic material that forms dielectric layers 132, 134, 136 and 138. Thermal decomposition may be facilitated using conventional equipment, such as a furnace or oven. Depending upon the materials selected, plasma tools may be appropriate as well, as would be apparent to one skilled in the art.

In another embodiment of the invention the sacrificial dielectric material and the sacrificial component may be materials that can be removed by selectively decomposing and removing it and on the basis of chemical agent selectivity to the sacrificial material. Suitable materials include but are not limited to polymers such as poly(vinylidene fluoride), poly(tetrafluoroethylene), perfluoro(meth)acrylates, and poly(dimethyl siloxane). Perfluoropolyethers, highly-branched p-FOA, or block copolymers such as pFOA-b-MMA.

In other embodiments of the invention the sacrificial dielectric material and sacrificial component may even be a conventional low-k material such as a low-k organosilicon material (e.g., Black Diamond™, Silk™, and CORAL™), which subsequently can be removed, for example, by oxygen plasma etching. The sacrificial dielectric material and the porogen material themselves can be formed using chemical vapor deposition (CVD), plasma-enhanced CVD, atomic layer deposition (ALD), or any other appropriate technique.

Because the present invention employs two or more dielectric layers (e.g., layers 132, 136 and 140) separated by spacer layers (e.g., layers 130, 134, and 138), the resulting dielectric structure 112 has multiple parallel planes of dielectric material to support it. Thus, even when the lateral distance between conductive features such as the features 116$_1$ and 116$_2$ is large, the structure can maintain its mechanical integrity without collapsing.

The invention claimed is:

1. A method of making an inter-level dielectric for a microelectronic device formed on a substrate, comprising:

forming first and second spacer layers over a substrate layer, said spacer layers being formed from a sacrificial dielectric material;

forming first and second dielectric layers on the first and second spacer layers, respectively, such that each of the first and second dielectric layers is separated by one of the spacer layers, the first and second dielectric layers each including a first and second dielectric components, the second dielectric component being a sacrificial dielectric material;

removing at least a portion of the second dielectric component to thereby form voids in the first and second dielectric layers;

removing at least a portion of the sacrificial dielectric material in the first and second spacer layers to thereby form voids in the first and/or second spacer layers; and after the steps of forming the first and second spacer layers and forming the first and second dielectric layers, forming a recessed feature through the first and second spacers layers and the first and second dielectric layers, and filling the recessed feature with a conductive material.

2. The method of claim 1 wherein the step of removing at least a portion of the sacrificial dielectric material in the first and second spacer layers comprises the step removing a majority of the sacrificial dielectric material.

3. The method of claim 1 wherein the step of removing at least a portion of the sacrificial dielectric material in the first and second spacer layers comprises the step removing substantially all of the sacrificial dielectric material.

4. The method of claim 1 wherein the first dielectric component comprises a material selected from the group consisting of $SiO_2$, SiCOH, BN and SiOF.

5. The method of claim 1 wherein the first dielectric component comprises a low-k material.

6. The method of claim 1 wherein the sacrificial dielectric material forming the first and second spacer layers and the second dielectric component are a common dielectric material.

7. The method of claim 1 wherein the sacrificial dielectric material forming the first and second spacer layers and the second dielectric component are different dielectric materials.

8. The method of claim 1 further comprising the step forming a barrier layer over the recessed feature.

9. The method of claim 8 further comprising the step of forming a seed layer over the barrier layer.

10. The method of claim 1 wherein the conductive material comprises copper.

11. The method of claim 9 wherein the conductive material comprises copper.

12. The method of claim 1 wherein the sacrificial dielectric material comprises a material selected from the group consisting of branched poly(p-xylene), linear poly(p-phenylene), linear polybutadiene, branched polyethylene, PET, Nylon 6/6, PS-syn, poly(e-caprolactone), PPO, polycarbonate, PPS, PAI, PPA, PMS, PEEK, and PEK.

13. The method of claim 12 wherein at least one of the removal steps is performed by thermal decomposition.

14. The method of claim 1 wherein at least one of the removal steps is performed by chemical etching.

15. The method of claim 1 wherein at least one of the removal steps is performed by plasma etching.

16. The method of claim 1 wherein the sacrificial dielectric material comprises a polymer material.

17. The method of claim 16 wherein the polymer material is selected from the group consisting of poly(vinylidene fluoride), poly(tetrafluoroethylene), perfluoropolyether, perfluoro(meth)acrylate, poly(dimethyl siloxane), pFOA and pFOA-b-MMA.

18. An inter-level dielectric constructed in accordance with the method of claim 1.

* * * * *